(12) United States Patent
Hirose et al.

(10) Patent No.: US 6,456,480 B1
(45) Date of Patent: *Sep. 24, 2002

(54) PROCESSING APPARATUS AND A PROCESSING METHOD

(75) Inventors: Osamu Hirose, Kumamoto; Tetsuya Sada, Kumamoto-ken, both of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/371,842

(22) Filed: Aug. 11, 1999

Related U.S. Application Data

(63) Continuation-in-part of application No. 09/046,536, filed on Mar. 24, 1998, now Pat. No. 6,002,572.

(30) Foreign Application Priority Data

Mar. 25, 1997 (JP) ............................................. 9-91538

(51) Int. Cl.⁷ ............................................... H05F 3/06
(52) U.S. Cl. ...................... 361/213; 361/212; 361/234
(58) Field of Search ............................... 361/212, 213, 361/220, 225, 229, 230, 234

(56) References Cited

U.S. PATENT DOCUMENTS

| | | | |
|---|---|---|---|
| 3,976,916 A | 8/1976 | Saurenman | |
| 4,319,302 A | 3/1982 | Moulden | 361/213 |
| 4,333,123 A | 6/1982 | Moulden | 361/213 |
| 4,339,782 A | 7/1982 | Yu et al. | 361/229 |
| 4,551,192 A * | 11/1985 | Di Milia et al. | 156/345 |
| 4,667,110 A | 5/1987 | Kariya | 361/234 |
| 4,974,115 A | 11/1990 | Breidegam et al. | 361/231 |
| 5,057,966 A | 10/1991 | Sakata et al. | 361/213 |
| 5,116,583 A | 5/1992 | Batchelder et al. | 361/231 |
| 5,382,311 A | 1/1995 | Ishikawa et al. | 156/345 |
| 5,474,614 A | 12/1995 | Robbins | 361/234 |
| 5,488,222 A | 1/1996 | Bault et al. | 361/225 |
| 5,550,703 A | 8/1996 | Beyer et al. | 361/213 |
| 5,552,955 A | 9/1996 | Mashiro et al. | 361/234 |
| 5,583,736 A * | 12/1996 | Anderson et al. | 361/234 |
| 5,596,478 A | 1/1997 | Ohmi et al. | 361/212 |
| 5,621,605 A | 4/1997 | Inaba et al. | 361/213 |
| 5,677,824 A * | 10/1997 | Harashima et al. | 361/234 |
| 5,750,011 A | 5/1998 | Ohmi et al. | 361/231 |
| 5,761,023 A * | 6/1998 | Lue et al. | 361/234 |
| 5,777,838 A * | 7/1998 | Tamagawa et al. | 361/234 |
| 5,815,366 A * | 9/1998 | Morita et al. | 361/234 |
| 5,825,607 A | 10/1998 | Burkhart | |
| 5,956,837 A * | 9/1999 | Shiota et al. | 361/234 |
| 6,002,572 A * | 12/1999 | Hirose et al. | 361/234 |
| 6,028,762 A | 2/2000 | Kamitani | |
| 6,104,595 A * | 8/2000 | Brown | 361/212 |

\* cited by examiner

*Primary Examiner*—Fritz Fleming
(74) *Attorney, Agent, or Firm*—Rader, Fishman & Grauer PLLC

(57) ABSTRACT

The processing apparatus prevents difficulty in separation of the substrate from the base because of charges on the substrate when the substrate is lifted from the base for substrate placing during processing. The processing apparatus comprises pins to lift up the substrate on the base and a neutralization apparatus to discharge ionized gas to the gap between the bottom of the substrate lifted from the base by the pins and the top of the base. When ionized gas is discharged to the substrate and the base, the charges are neutralized. In addition, the processing apparatus comprises three or more of proximity pins, which form gap between the bottom of the substrate on the base and the top of the base to prevent a frictional electricity being formed therein.

18 Claims, 11 Drawing Sheets

PROCESSING APPARATUS AND A PROCESSING METHOD

This is a Continuation-In-Part application of U.S. Ser. No. 09/046,536, filed Mar. 24, 1998, now U.S. Pat. No. 6,002,572, issued Dec. 14, 1999, which claimed priority of Japanese Patent Application No. 9-91538 filed Mar. 25, 1997.

BACKGROUND OF THE INVENTION

1. Field of the Invention

The present invention relates to a processing apparatus and a processing method for processing to dry substrates such as, for example, LCD substrates or semiconductor wafers.

2. Description of the Related Art

In fabrication of liquid crystal displays (LCD) or semiconductors, the technology called "lithography" is applied to form resist patterns on the surface of the LCD substrate or semiconductor wafer serving as the bases. Lithography processing contains various processes such as substrate cleaning, substrate drying, resist application to: the substrate surface and exposure and development of such resist. In these processes, heaters are used for the above drying process, for example. As an example of such heaters, a apparatus to place a substrate on a base for substrate heating is known. Such a heater is provided with several pins projecting upward from the base to support the bottom of the substrate when the substrate is received and passed so that it receives the substrate above the base by raising the pins and passes the received substrate to the base by lowering the pins. After heating on the base, it can lift the substrate above the base by pushing the substrate with pins from the bottom.

However, when a substrate made of an insulating material (LCD substrate, in particular) is placed on the base, static electricity tends to be generated between the substrate and the top of the base. For this reason, the substrate may adhere the top of the base and thereby preventing smooth lifting when it is to be lifted by pins from the base. In particular, an LCD substrate constituted by a thin glass plate is easily warped, which makes its separation from the base difficult In addition, when the substrate is lifted above the base, the polarization effect may cause charges of opposite polarities on the top and bottom face of the substrate.

SUMMARY OF THE INVENTION

It is an object of the present invention to provide a means for effectively removing charges on the top and bottom surface of the substrate lifted from the base.

To attain the above object, a processing apparatus according to the present invention comprising a base to place a substrate on it and pins to raise and lower the substrate on the base is provided with an ionizer beside the base.

An insulating substrate such as an LCD substrate is placed above the base so that the pins receive it at their top ends and go down to place it on the base. The substrate is subjected to heating or other processing on the base. After the processing, the substrate is lifted from the base by raising of the pins. While the substrate is being lifted, the ionizer positioned beside the substrate discharges ions to remove the charges on the top and bottom faces of the substrate.

Thus, the substrate is smoothly separated from the base and lifted by the pins.

In a method according to the present invention, the substrate is lifted from the base with the ion supply from a side of the substrate starting before the beginning of the operation to lift the substrate off the base and, the substrate is lifted at a first speed while at least a part of the substrate is in contact with the top of the base and at a second speed greater than the first speed above after the substrate has completely left the top of the base. Thus, the substrate can be smoothly lifted.

DESCRIPTION OF PREFERRED EMBODIMENTS

Figure 1:
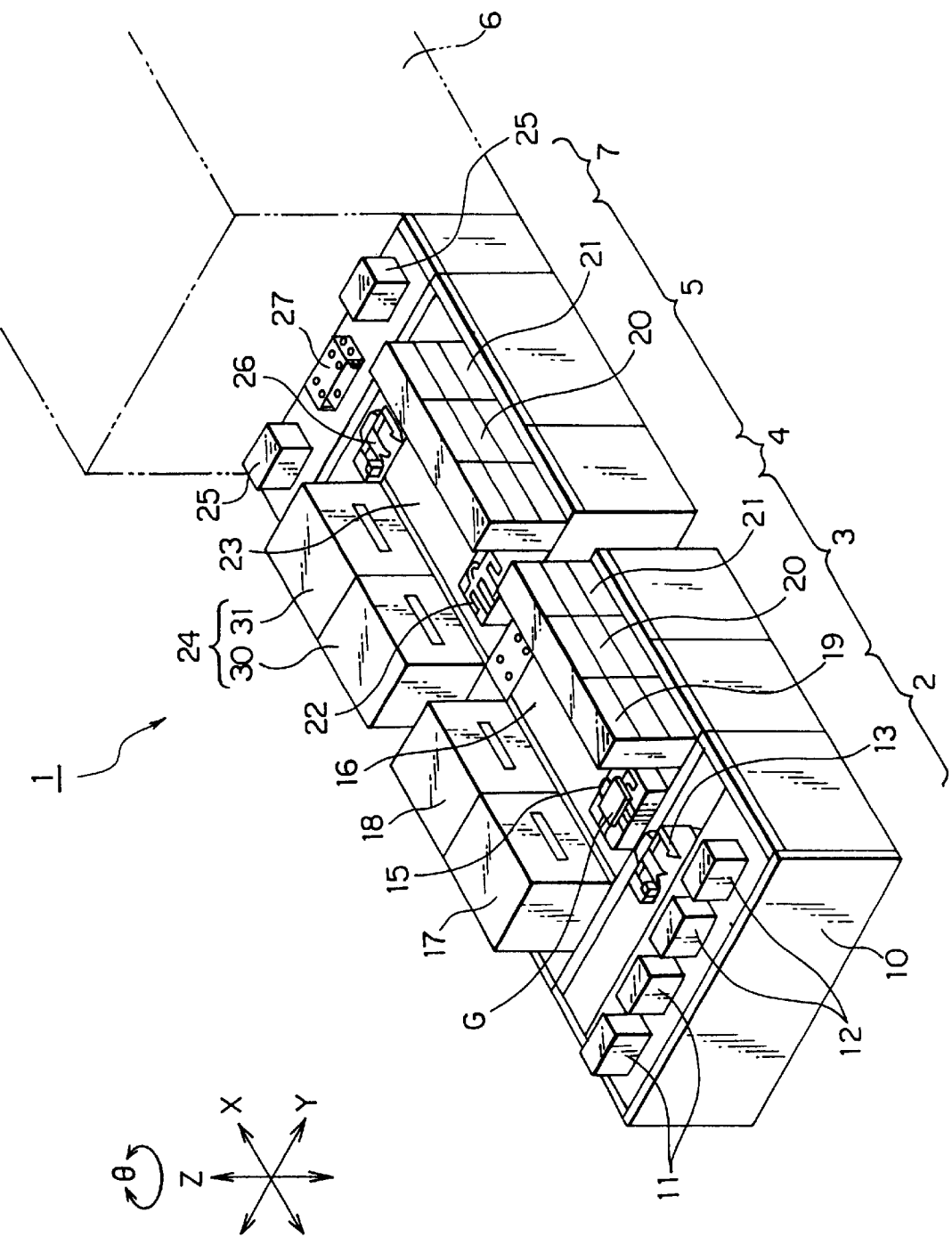
FIG. 1 is a perspective view to show the general outline of an coater-developer system incorporating a apparatus according to the present invention.
Figure 2:
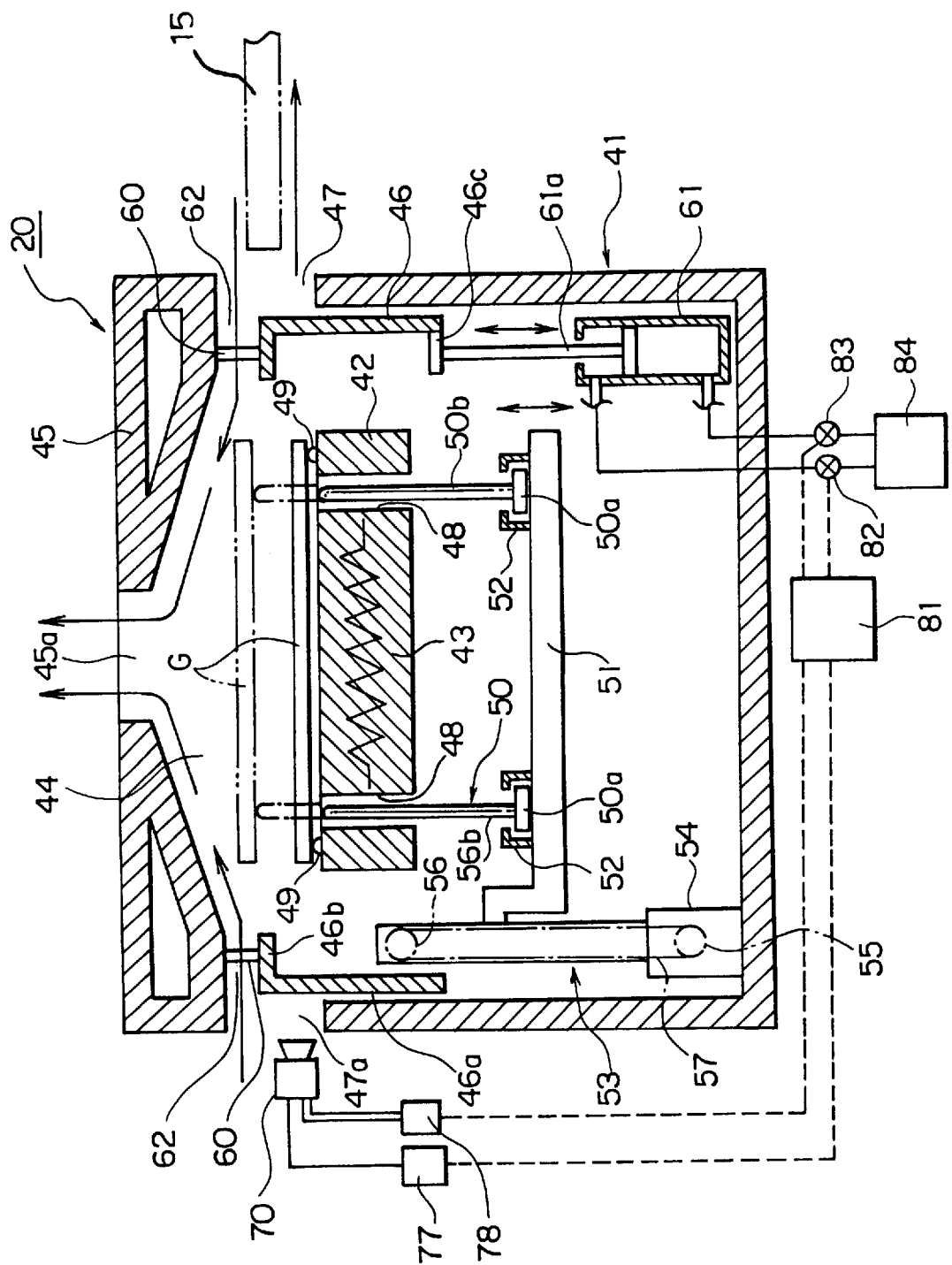
FIG. 2 is a sectional view of a heater according to a first embodiment of the present invention.
Figure 3:
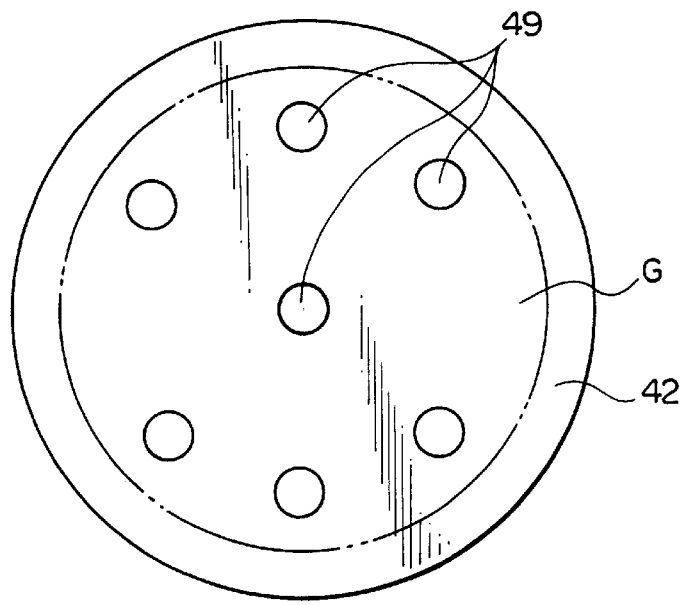
FIG. 3 is a plan view showing a base used in the heater.

Referring to the attached figures, preferred embodiments of the present invention will be described below. FIG. 1 is a perspective view of a coater-developer system 1 to process the substrate using photo-lithography technology. The coater-developer system 1 is provided with a heater 20 as a processing apparatus according to a first embodiment. The coater-developer system 1 comprises a loader section 2 to carry in and out the LCD substrate G having a square shape for example, a first processing section 3 to process the LCD substrate G, a second processing section 5 installed in communication with the first processing section 3 via an interface section 4 and an interface section 7 to pass the LCD substrate G between the second processor 5 and, for example, an exposing apparatus 6.

The loader section 2 is provided with a cassette station 10. The cassette station 10 may freely have a plurality of cassettes 11 to store unprocessed LCD substrates G and a plurality of cassettes 12 to store processed LCD substrates G. The loader section 2 also comprises a sub-transfer arm 13 to carry in or out unprocessed LCD substrates G. The sub-transfer arm 13 is designed to be able to move in Y and Z directions and to rotate in θ direction.

The first processing section 3 has various processing apparatuses to conduct certain processing to the LCD substrate G on both sides of a transfer route 16 for a main transfer arm 15. On one side of the transfer route 16, a brush cleaning apparatus 17 to clean the LCD substrate G taken out of the cassette 11 and a developer 18 are positioned side by side. On the other side of the transfer route 16, an adhesion apparatus 19 to conduct hydrophobicity processing for the LCD substrate G, a heater 20 and a cooling apparatus 21 to cool the LCD substrate G down to a certain temperature are properly stacked and disposed. The second processing section 5 has a coating/edge exclusion apparatus 24 according to the present invention on one side of a transfer route 23 for a main transfer arm 22 and a heater 20 and a cooling apparatus 21 properly stacked and disposed on the other side of the route.

The interface section 7 comprises a cassette 25 to temporarily keep the LCD substrate G for waiting and a sub-transfer arm 26 for the cassette 25 to put into and take out the LCD substrate G and a passing base for the LCD substrate G 27. The configuration and layout of such various apparatuses in the first processing section 3 and the second processing section 5 may be changed.

The configuration of the heater 20 according to the first embodiment incorporated to the coater-developer system 1 as above is described now. The heater 20 has a processing chamber 41 which comprises a base 42 to place the substrate G such as LCD substrate (glass substrate) inside and the base 42 has, inside of it, a heater 43 as a means to heat the substrate G via the base 42. The base 42 is, for example, made of aluminum alloy. The base 42 has a temperature sensor (not shown), which is designed to set a certain heating temperature in the range from 120 to 150° C., for example.

A plurality of fixed pins (proximity pins)49 are disposed on the front surface of the base 42. These fixed pins 49 allow the base 42 to hold a substrate G with a resultant gap, or space. In other words, the base 42 is prevented from directly contacting the substrate G. Thus, the substrate G is heated by heat radiation of the base 42. Since the substrate G does not contact the base 42, the substrate G is prevented from being contaminated by the base 42.

In addition, the substrate G is more equally heated by the heat radiation of the base 42 than the structure of which the substrate directly contacts the base 42 and is heated by conduction. This is because heat is more equally transmitted by heat radiation than that structure of which the substrate G is directly heated.

An further, because the substrate on the base is supported on the fixed pins, friction between the lower surface of the substrate and the upper surface of the base is prevented even when the substrate is expanded by the heat irradiated from the base. Therefore, formation of static electricity between the substrate and the base can be avoided.

Above the processing chamber 41 is a processing chamber top wall 45, which is a cover member to cover the top of the processing chamber 41 and form a processing space 44 with the base 42. The processing chamber top wall 45 has an exhaust 45a at the center. The processing chamber top wall 45 is mounted to a door 46 serving as a shutter member via spacing projection to be described later. By raising and lowering the door 46, an opening 47 between the processing chamber 41 and the processing chamber top wall 45 can be opened and closed to form or open the processing space 44.

The base 42 is, for example, provided with four through holes 48. A support pin 50 is movably inserted through each of these through holes to support the substrate G when it is passed and received. In other words, the through hole 48 has a size to allow horizontal moving of the support pin 50. The support pin 50 comprises a main pin 50b made of stainless steel having a foot 50a at the bottom end as well as corrosion-resistant pin assisting member made of, for example, PEEK (Polyether-ether-ketone), which is to be mounted to the top end of the main pin 50b. The foot 50a is supported by cylinder-shaped support members 52 projecting on the top of a holding member 51 so that the foot section 50a can move horizontally.

The holding member 51 with four support pins 50 as described above is connected to an elevation mechanism 53 so as to be able to go up and down, or so that it allows the support pins 50 to project upward through the through holes 48 of the base 42. The elevation mechanism 53 here comprises a stepping motor 54 serving as a driving motor, a driving pulley 55 driven by the stepping motor 54, a lowering pulley 56 disposed above the driving pulley 55 and a timing belt 57 extending over the driving pulley 55 and the folbottom pulley 56 to connect the holding member 51. Thus, the system is designed so that the support pins 50 and the base 42 can relatively move up and down by forward and backward revolutions of the stepping motor 54.

Figure 4A:
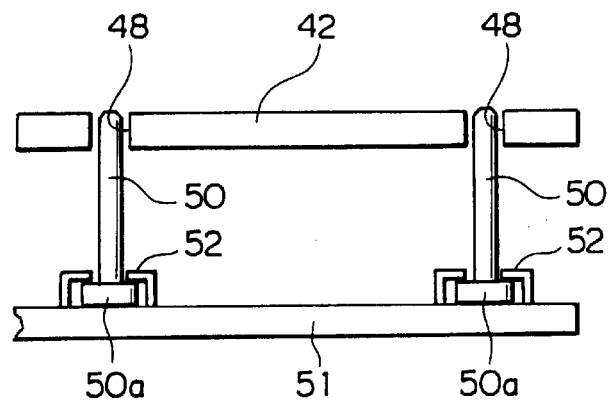
FIG. 4A and FIG. 4B are partial enlarged views showing a peripheral portion of the base of the heater.
Figure 4B:
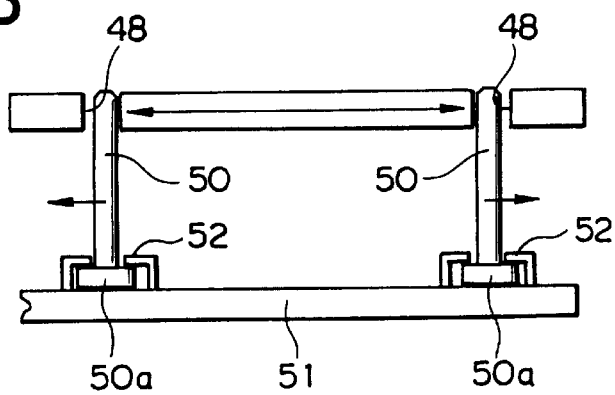
Figure 5:
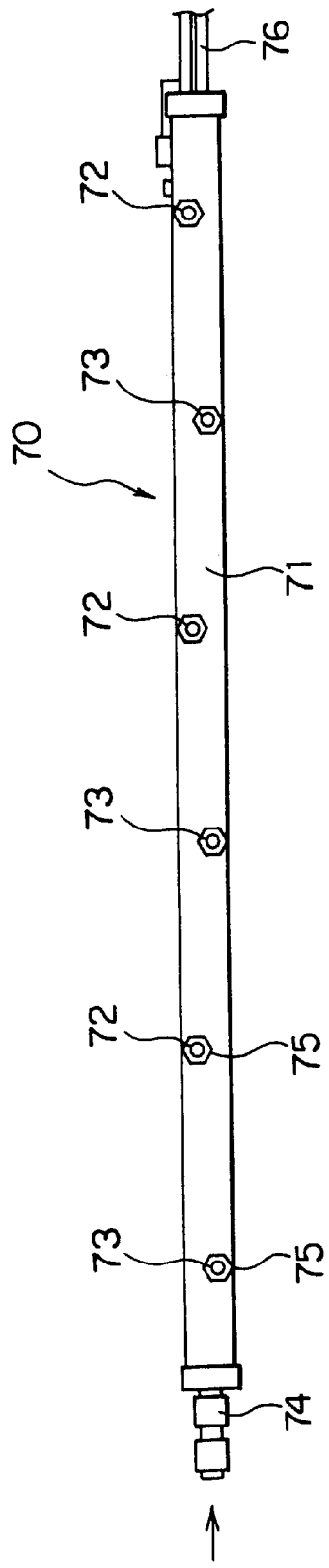
FIG. 5 is a front view of an ionizer used in the heater of FIG. 2.
Figure 6:
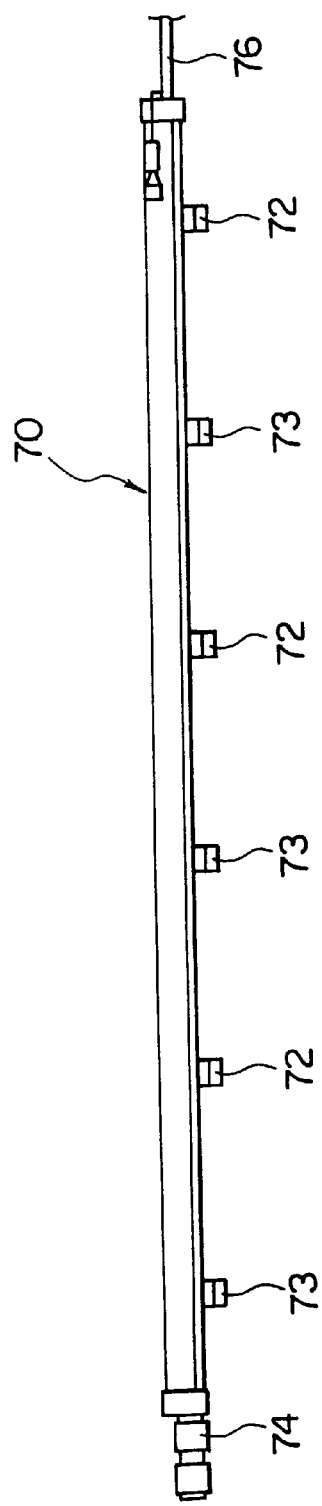
FIG. 6 is a top view of an ionizer used in the heater of FIG. 2.
Figure 7:
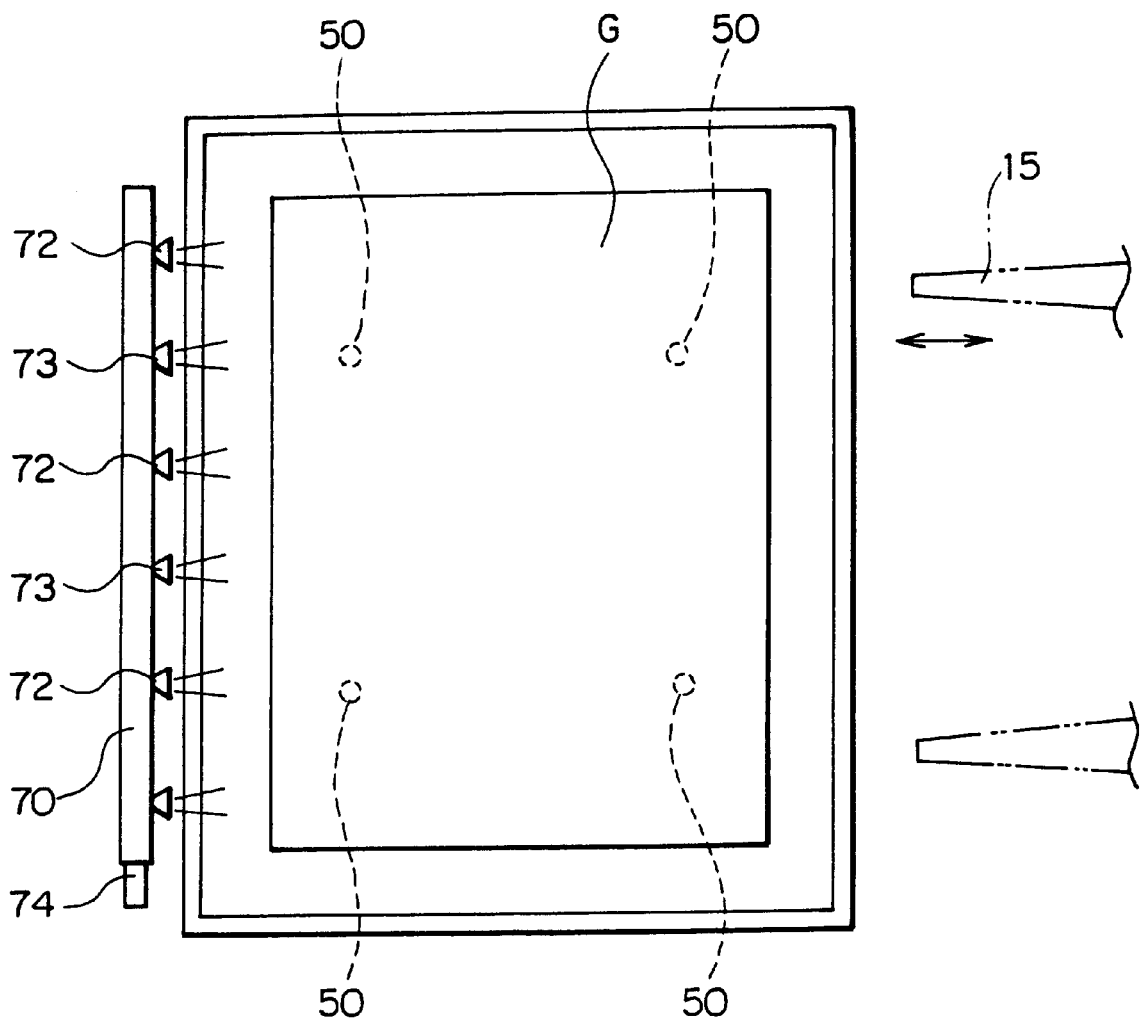
FIG. 7 is a disposition of the ionizer shown in FIG. 5.

Next, a heating process of a substrate G by the processing apparatus according to the present invention will be described. First, the base 42 is heated at a predetermined temperature of around 120° C. to 150° C. The main transfer arm 15 that holds a substrate G is entered from an opening 47 so as to place the substrate G on the base 47. Thereafter, the stepping motor 54 of the elevation mechanism 53 is driven. Thus, the support pins 50 are lifted up so as to support the substrate G on the support pins 50. Thereafter, the main transfer arm 15 is retreated. At this point, the positions of the through holes deviate from the state shown in FIG. 4A to the state shown in FIG. 4B due to. heat expansion. However, since the support pins 50 are held on the support members 52 in such a manner that the support pins 50 are horizontally movable, the support pins 50 outwardly move corresponding to the deviation of the through holes 48 and thereby the support pins 50 protrude from the base 42. Thus, the support pins 50 are not prevented from lifting up. In addition, particles due to contact of the support pins 50 and the through holes 48 do not take place.

The above door 46 is provided with an inward horizontal piece 46b at the top end of the square cylinder shaped main part 46a. Projecting at the four corners on the top of the inward horizontal piece 46b facing the bottom of the processing chamber top wall 44 are spacing projections 60 having a certain height h (1 to 5 mm, for example). For the above door 46, a bracket 46c projecting at the bottom end of the main part 46a is connected to the elevation mechanism, or a piston rod 61a of an air cylinder 61, for example. The door 46 moves up and down when driven by the air cylinder 61 to open and close the opening 47 of the processing chamber 41 and to form and open the processing space 44.

When the door 46 rises and the spacing projections 60 come into contact with the bottom of the processing chamber top wall 45, an air inlet 62 set and held for a certain dimension h is formed between the bottom of the processing chamber top wall 45 and the top of the door 46. Thus, a constant amount of external air flows into the processing space 44 via the air inlet 62 during the heating process of the substrate G so as to maintain the rate of the air discharged from the exhaust 45a constant, which results in a fixed heating temperature for the substrate G.

Through the opening 47 on one side of the processing chamber 41 above, the main transfer arm 15 goes in and goes out to receive the substrate G on the support pins 50 and to pass the substrate G to the support pins 50. Disposed outside of an opening 47a on the other side is an ionizer 70 as a neutralizing apparatus. The ionizer 70 has a main unit 71 with an end closed and nozzles 72 and 73 disposed at top and bottom levels on one side of the main unit 71. These nozzles 72 and 73 are disposed at equivalent pitches (at about 90 mm intervals, for example) and so that the top nozzles 72 and the bottom nozzles 73 are not positioned vertically in line when seen from the top. The nozzles 72 and 73 of the ionizer 70 are disposed along the longer edge of the substrate G.

The size of the substrate is 650 mm×830 mm. A plurality of nozzles are disposed in the longitudinal direction (longer side of 830 mm) of the substrate at intervals of around 90 mm.

Thus, in the longitudinal direction, a plurality of streams of ionized gas are formed. Consequently, even if the substrate is large, static electricity can be effectively removed.

On the other end of the main unit 71, a gas inlet 74 is provided. When fresh air, nitrogen gas or other inert gas is supplied to the gas inlet 74, it is discharged from the above nozzles 72 and 73. The nozzles 72 and 73 are provided with a needle-shaped discharge electrode 75. When the electricity is supplied from a power cable 76, the discharge electrode 75 discharges the power and the above fresh air, nitrogen gas or other inert gas discharged from the nozzles 72 and 73 is ionized and exhausted in the blowing direction of the nozzles on the flow of the discharged air. The electricity is supplied from a power supply 77 and fresh air and other gases are supplied from an air supply source 78.

The supply of power and gas or the operation of the ionizer 70 is controlled by a controller 81. The controller 81 also controls opening and closing of valves 82 and 83, which operate the air cylinder 61 driving the door 46. When the valve 82 is opened, the gas from a gas supply source 84 is supplied to the air cylinder 61 and pushes up the piston rod 61a. Thus, the door 46 rises and closes the opening 62. When the valve 83 is opened, the gas from the gas supply source 84 is supplied to the other space in the air cylinder 61 and pushes down the piston rod 61a. This lowers the door 46 and opens the opening 62.

Figure 8:
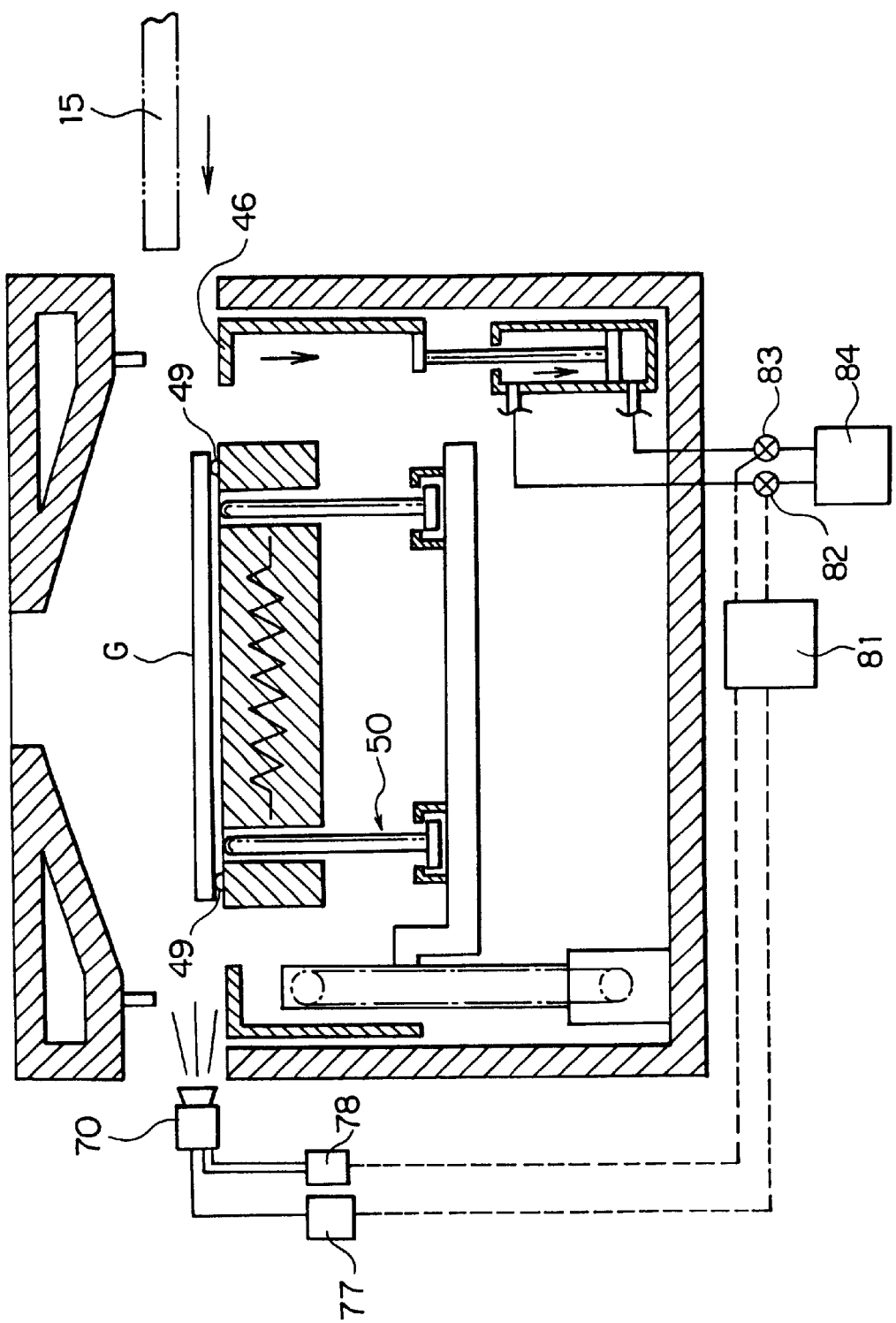
FIG. 8 is a sectional view to show the status where the door is open for the heater of FIG. 2.

The controller operates the ionizer 70 when it opens the door 46. Thus, as shown in FIG. 8, ionized gas is discharged from the nozzles 72 and 73 to the top of the base 42 in the process chamber 41 and to the back of the substrate G. This neutralizes and removes the charges on the substrate G. Thus, subsequent raising of the pins 50 and lifting up of the substrate G from the top of the base 42 can be made smoothly. The nozzles 72 discharge the ionized gas to the side near the main transfer arm 18 of the substrate G and the nozzles 73 to the other side of the substrate G. In this way, ions are supplied evenly to the entire substrate G, which effectively neutralizes the substrate G. The nozzles 72 and 73 have a taper shape with a gradually enlarging diameter and can supply ions for a wide range.

Figure 9:
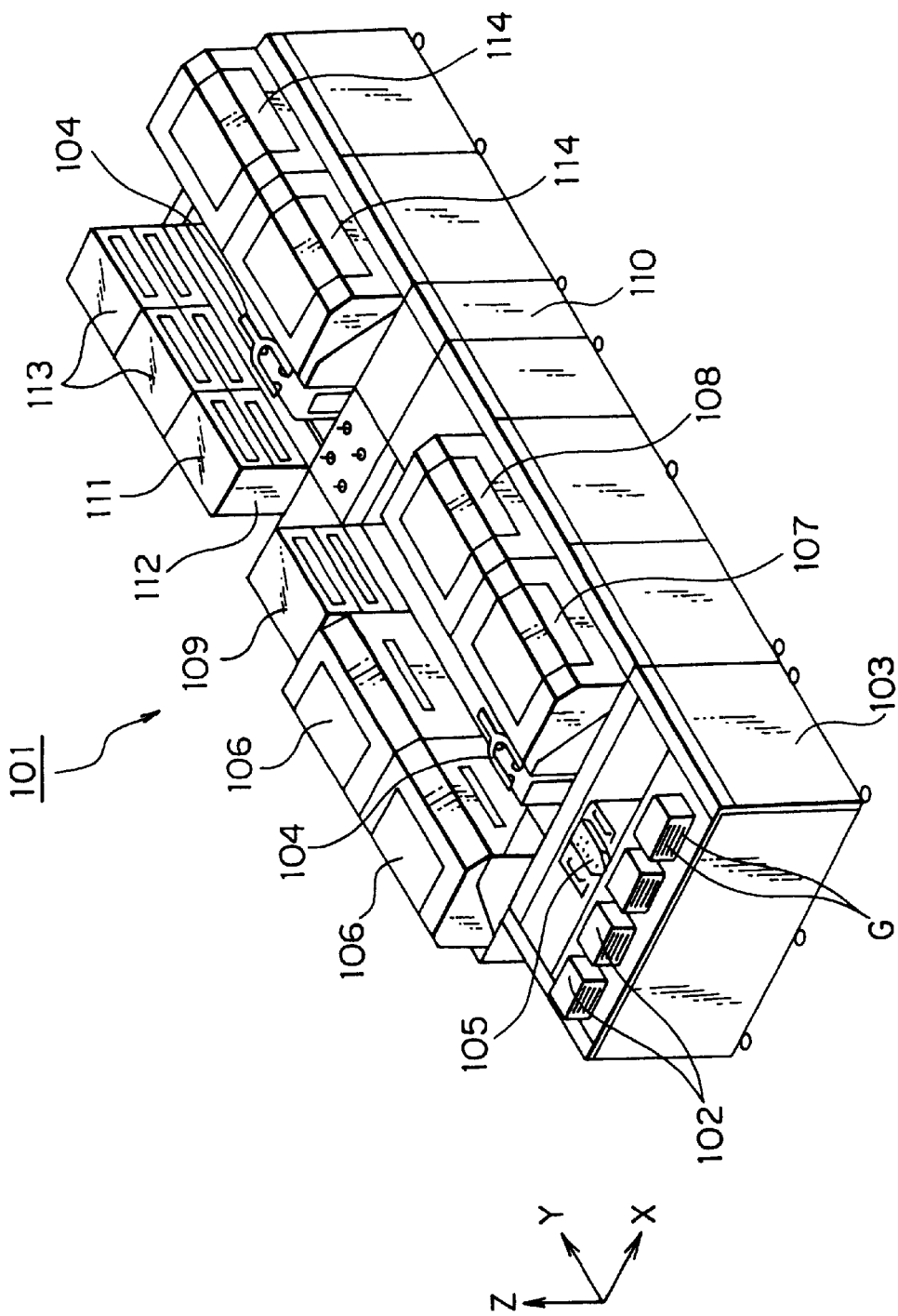
FIG. 9 is a perspective view to show the general outline of a resist processing system incorporating a apparatus according to the present invention.

A second embodiment of the present invention is described now. A resist processing system 101 shown in FIG. 9 is provided with a cassette station 103 on an end. The cassette station 103 has several cassettes 102 accommodating LCD substrates G (hereinafter referred to as the "substrate G") placed on it. Disposed on the front side of the cassettes 102 on the cassette station 103 is an auxiliary arm 105 which transfers and positions the substrate G and at the same time holds and passes the substrate G to and from main arms 104. Two main arms 104 are laid out in series so that they can move longitudinally at the center of the processing system 101. Developers 106 and other various processing apparatuses are disposed on both sides of the transfer route.

In the processing system 101 as shown in the figure, a brush scrubber 107 to clean the substrate G with a brush and a high pressure jet cleaner 108 to clean it with high pressure jet water are disposed side by side beside the cassette station 103. In addition, two developers 106 are disposed on the opposite side of the transfer route for the main arm 104 and two heaters 109 are stacked next to them.

Beside these apparatuses, an adhesion apparatus 111 to conduct hydrophobicity processing for the substrate G before coating of the resist on it is provided via a connection interface unit 110. Below the adhesion apparatus 111 is a cooling apparatus 112 for cooling. Further, beside these adhesion apparatus 111 and cooing apparatus 112, two sets of heaters 113 each having two heaters stacked are positioned. On the opposite side of the transfer route for the main arm 104, two resist coating units 114 which coat resist liquid onto the substrate G to form the resist (photosensitive film) on the surface of the substrate G. Though not shown, an exposing apparatus to expose the resist formed on the substrate G for certain fine patterns and other apparatuses are disposed beside the resist coating units 114.

The main arm 104 is provided with an X axis driving mechanism, Y axis driving mechanism and Z axis driving mechanism (Directions of X, Y and Z axes are shown in FIG. 1). Further, it is provided with a θ rotation driving mechanism for rotations around the Z axis. The main arm 104 properly runs along the central route of the resist processing system 101 and transfers the substrate G for processing apparatuses 106, 109, 111 to 113. The main arm 104 carries in the substrate G before processing to the processing apparatuses 106, 109 and 111 to 113 and carries out the substrate G after processing from the processing apparatuses 106, 109 and 111 to 113.

Figure 10:
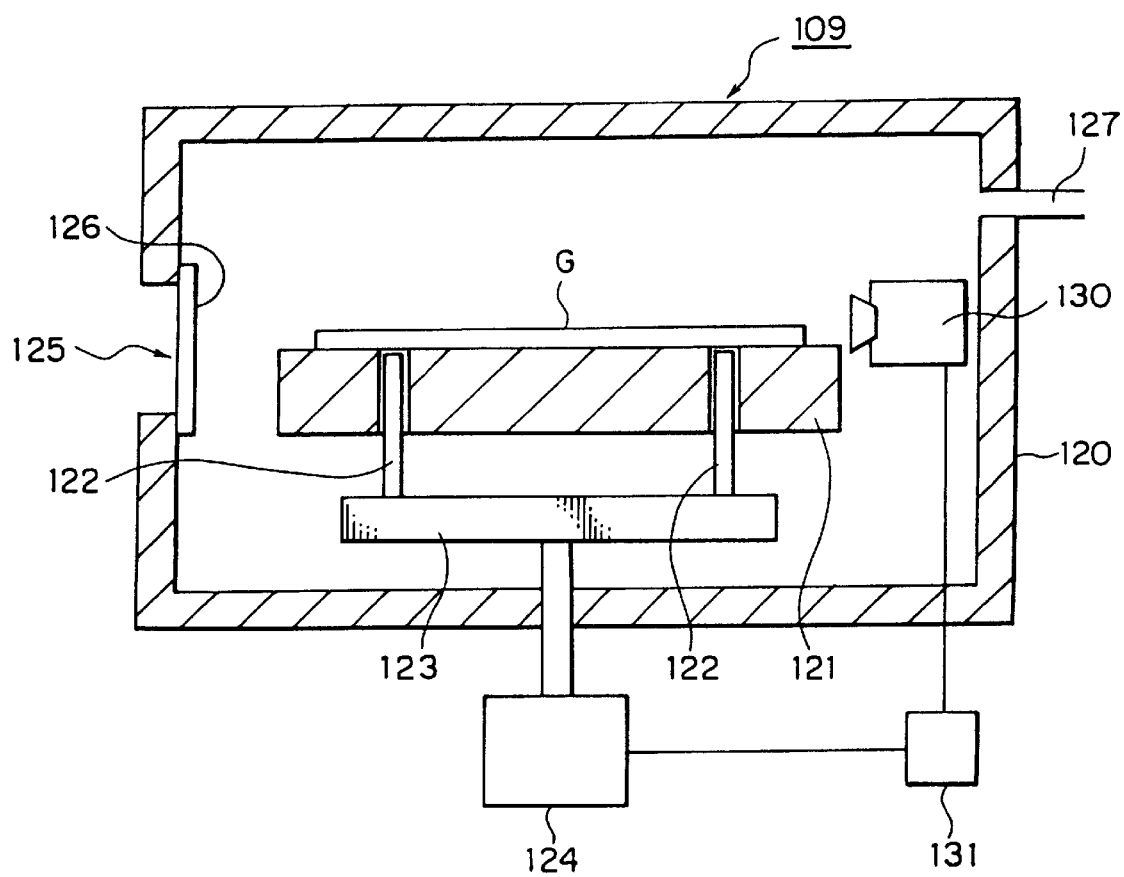
FIG. 10 is a sectional view of a heater according to a second embodiment of the present invention.

Among these apparatuses, the heater 109 and the heater 113 have a similar configuration. Described below is the configuration of the heater 109 representing these apparatuses. As shown in FIG. 10, the heater 109 is provided with a base 121 to place a substrate G on it inside of a casing 120. Though not shown, the base 121 has an incorporated heater and can dry the substrate G by heating the substrate G placed on the base 121.

A plurality of pins (four pins 122, for example) which project upward from the top of the base 121 to push up the bottom of the substrate G when receiving and passing it are inserted to the base 121 so that they can freely go up and down. The bottom ends of the pins 122 are supported by an elevation mechanism 124 incorporating a stepping motor via an elevation frame 123.

Figure 11:
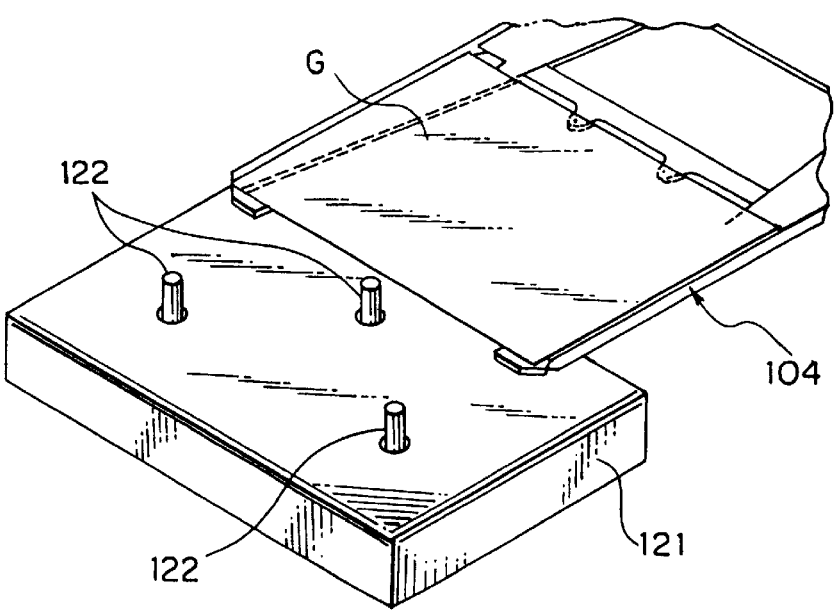
FIG. 11 is a perspective view to show the substrate passing to the base by the main arm.

The casing 120 has, on the side facing the transfer route for the main arm 104, a window 125 for carrying in and out the substrate G. The window 125 is opened and closed with a shutter 126. Though not shown, a sensor to detect the opening and closing operation with the shutter 126 is provided. Via the window 125 opened by the rise of the shutter 126, the substrate G is carried into the casing 120 by the main arm 104 as shown in FIG. 11. The substrate G thus carried in is received from the main arm 104 by the pins 122 pushing it up and, after the main arm 104 goes out of the casing 120, the pins 122 go down so that the substrate G is placed on the base 121.

As shown in FIG. 10, at the top section of the casing is an exhaust duct 127 to discharge the gas generated during heating of the substrate G on the base 121. Disposed beside the substrate G placed on the base 121 in the casing 120 is an ionizer 130, which characterize the present invention. The operations of the ionizer 130 and the elevation mechanism 124 are controlled by a controller 131. The ionizer 130 has a discharge electrode and an opposite electrode inside. By applying AC voltage to the discharge electrode and DC voltage to the opposite electrode to cause corona discharge between the electrodes and by supplying clean air into the ionizer 130, ions can be discharged by the air flow. As described later, the heater 109 is designed so that, when the substrate G is lifted from the base 121 by the pins 122, ions are discharged from the ionizer 130 and supplied to both top and bottom of the substrate G.

Described below is a case where the substrate G is heated and dried using the heater 109. As shown in FIG. 9, the substrate G is first taken out of the cassette 102 placed on the cassette station 103 by the auxiliary arm 105 and passed to the main arm 104. The main arm 104 carries in the substrate G to the brush scrubber 107 and the brush scrubber 107 cleans the substrate G with a brush. Depending on the process, the substrate G may be cleaned with high pressure jet water in a high pressure jet cleaner 108. The substrate G thus cleaned is transferred by the main arm 104 and carried into the heater 109.

Figure 12:
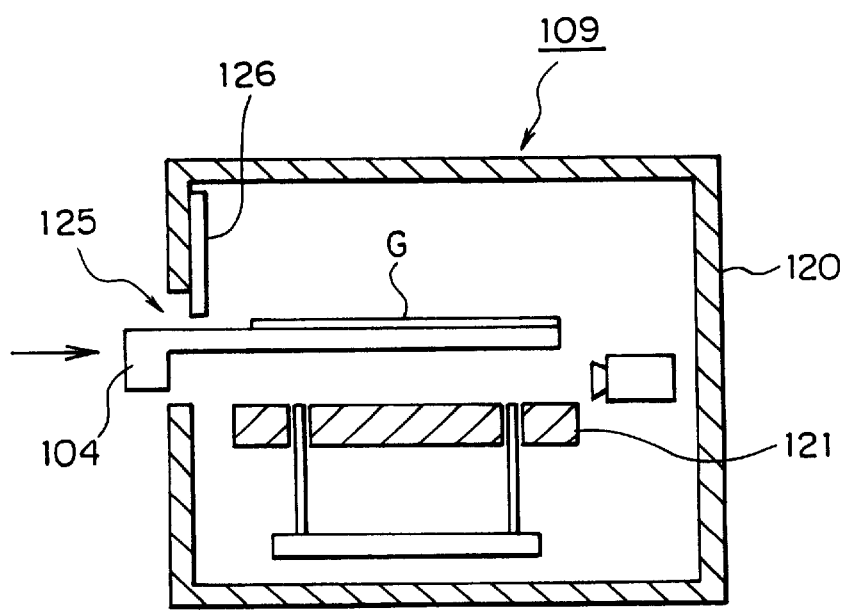
FIG. 12 is a sectional view of the heater to show the status where the substrate is carried into the casing by the main arm.
Figure 13:
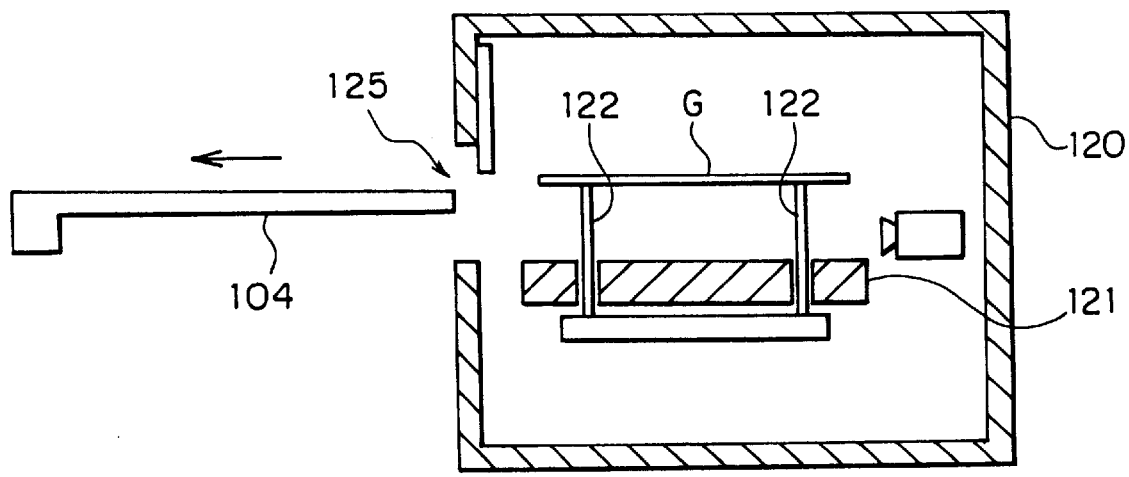
FIG. 13 is a sectional view of the heater to show the status where the substrate is received at the top ends of the pins.

At the time when the substrate G is carried in, as shown in FIG. 12, the window 125 on the casing 120 of the heater 109 is opened by the rise of the shutter 26. Via the open window 125, the main arm 104 goes into the casing 120 and thus the substrate G is carried into a space above the base 121. After carrying in, the pins 122 rise and push up the bottom of the substrate G supported by the main arm 104 and receive the substrate G at the top ends of the pins 122. Then, as shown in FIG. 13, the main arm 104 goes out of the casing 120 through the window 125.

Figure 14:
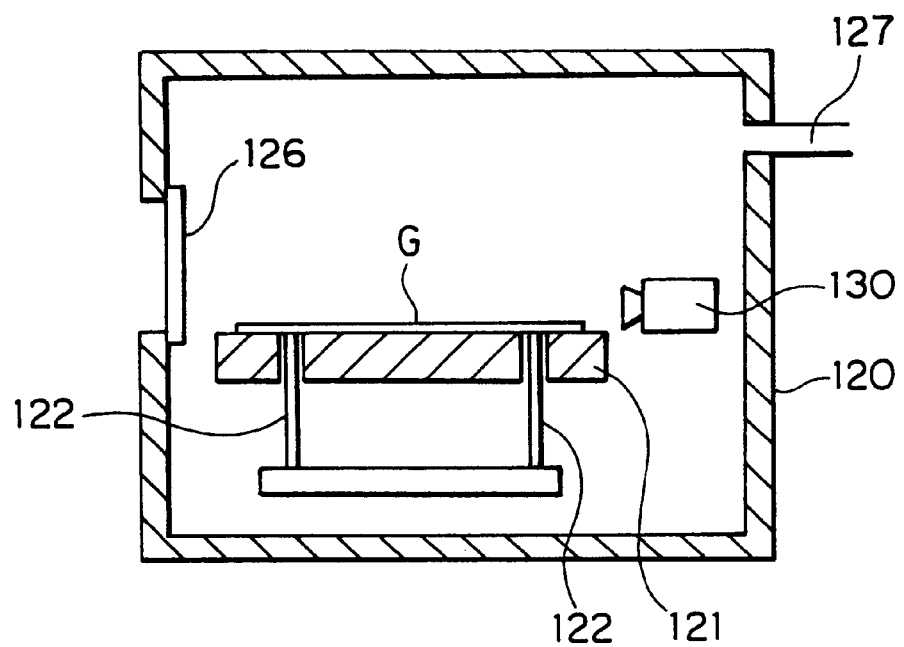
FIG. 14 is a sectional view of the heater to show the status where the substrate is placed on the base.

When the main arm 104 thus goes out of the casing 120, the shutter 126 lowers and closes the casing 120 as shown in FIG. 14. The lowering of the shutter 126 is checked by a sensor (not shown). After such checking, the pins 122 go down and the substrate G is placed on the base 121. The substrate G is heated and dried by the heat from the heater incorporated in the base 121. At the same time, by the exhaust from the exhaust duct 127, gases generated in heating of the substrate G are discharged to outside of the casing 120.

Upon completion of the drying process for the substrate G, the pins 122 go up and project upward from the top of the base 121 and push up the bottom of the substrate G. By the start of lifting up of the substrate G off the base 121 with the rise of the pins 122, the ionizer 130 disposed beside the substrate G starts to supply ions. Upon completion of drying for the substrate G, the ionizer 130 may start to supply ions after elapse of a certain time period according to the predetermined sequence.

Figure 15:
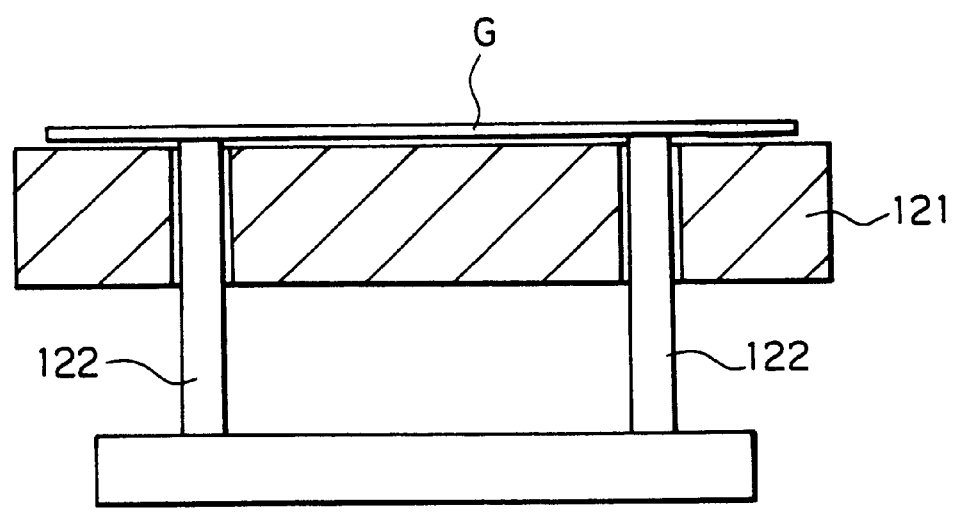
FIG. 15 is an enlarged sectional view to show the status where the substrate is started to be lifted from the base.

When lifting of the substrate G is started, as shown in FIG. 15, a part of the substrate G (periphery sections, in particular) is still in contact with the top of the base 121. In particular, the LCD substrate made of a thin glass plate is susceptible to warp and the periphery sticks to the top of the base 121 by static electricity, which makes it difficult to be removed. In such case, pushing at an excessively high speed may cause the substrate G to jump up on the pins 122 in reaction at the moment when the periphery of the substrate G, which has been in contact with the top of the base 121 by static electricity, leaves the base. If the substrate G thus jumps up on the pins 122, it cannot be constantly positioned when it is passed from the pins 122 to the main arm 104, resulting in a transfer failure.

Therefore, in lifting of the substrate G from the base 121 by raising of the pins 122, while at least a part of the substrate G is in contact with the top of the base 121, the number of revolutions of the stepping motor incorporated in the elevation mechanism 124 is made relatively low under control of the controller 131 so that the pins 122 are raised at a first rate to prevent jumping of the substrate G at the moment when the periphery of the substrate G is separated from the base. Note that the ionizer 130 continues to supply ions even while the substrate G is raised from the base 121 at a first speed. Thus, ions are supplied to the gap between the top of the base 121 and the bottom of the base G for neutralization.

After the substrate G completely leaves the top of the base 121 by such raising of the pins 122 at a first speed, there is no concern of jumping of the substrate G on the pins 122. The controller 131 may now control the number of revolutions of the stepping motor incorporated in the elevation mechanism 124 to be relatively higher and raise the pins 122 at a second speed, which is faster than the first speed. In this case, however, it is preferable to temporarily stop raising of the pins 122 by suspending the revolutions of the stepping motor incorporated in the elevation mechanism 124 under control of the controller 131 for a certain period immediately after the entire substrate G completely leaves the top of the base 121 so as to stop the operation to lift up the substrate G from the base 121 as shown in FIG. 16.

Specifically, by slowly raising the pins 122 at the first speed in early stage of lifting of the substrate G from the base 121 as described above, it becomes possible to prevent jumping of the substrate G. However, even when the substrate G is slowly raised, it is difficult to completely eliminate vibrations of the substrate G at the moment when the periphery of the substrate G leaves the base. If the pins 122 are raised at the second speed faster than the first speed while the substrate G is in the status with vibration, it is still concerned that the substrate G supported at the top ends of the pins 122 may be displaced.

Figure 16:
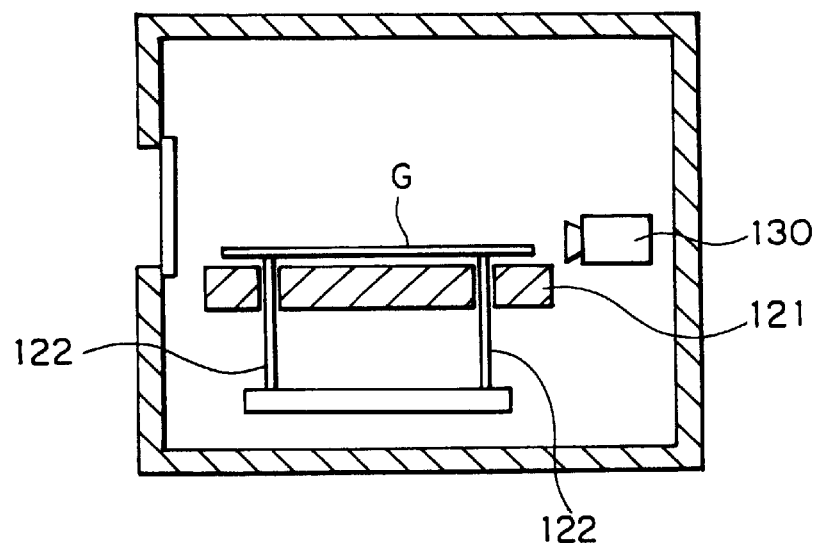
FIG. 16 is a sectional view of the heater to show the status where the substrate lifting is temporarily stopped.

As shown in FIG. 16, it is preferable to temporarily stop raising of the substrate G immediately after the entire substrate G completely leaves the top of the base 121 and restart raising of the substrate G after the substrate G stops its vibration. Raising of the substrate G can be temporarily stopped by temporarily stopping the revolutions of the stepping motor incorporated in the elevation mechanism 124 under control of the controller 131. The stop period differs depending on various factors including size, shape, thickness and material of the substrate G, and may be about 5 seconds, for example. Even while lifting of the substrate G is temporarily stopped and while the substrate G is lifted at the second speed after restart of raising of the pins 122, the ionizer 130 continues to supply ions to neutralize the substrate G.

Figure 17:
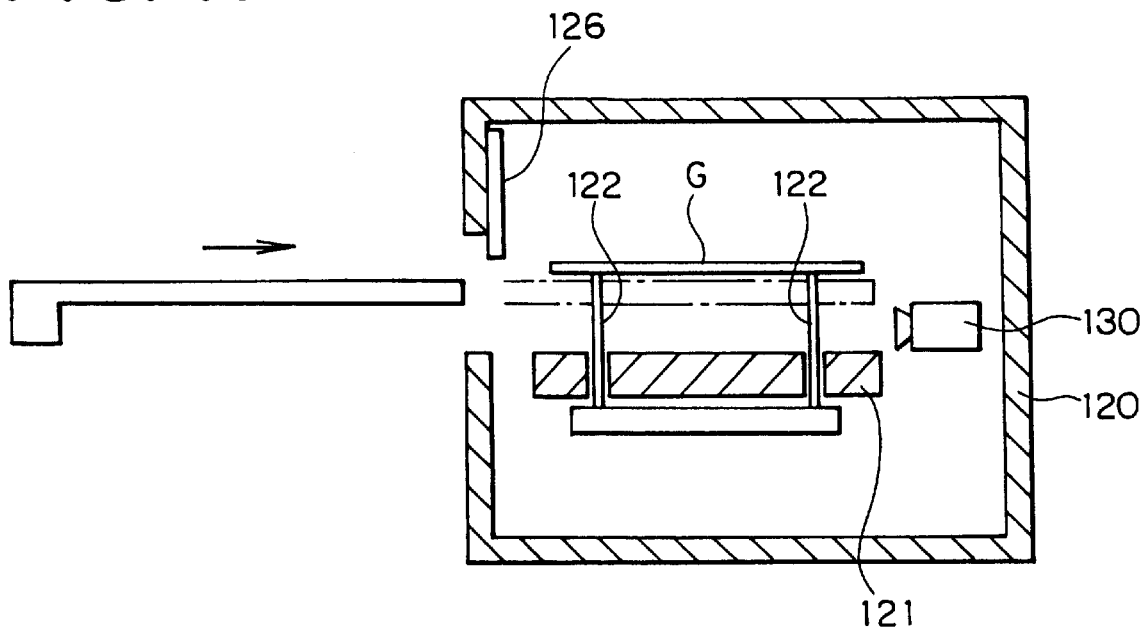
FIG. 17 is a sectional view of the heater to show the status where the substrate is carried out from the casing by the main arm.

As shown in FIG. 17, when raising of the pins 122 is completed and the substrate G after neutralization is supported above the base 121, the shutter 126 goes up to open the window 125. Rise of the shutter 126 and opening of the window 125 are detected by a sensor (not shown). Upon sensing of such operations by the sensor, the ionizer 130 stops supplying ions. For safety, the ionizer 130 may be designed to stop supply of ions after elapse of a certain time period according to a predetermined sequence. After checking that the window is open by the sensor detection, the main arm 104 comes into the casing 120 via the open window 125.

After the main arm 104 comes in, the pins 122 go down and passes the substrate G which has been supported by the top ends of the pins 122 to the main arm 104. Then, the substrate G is carried to outside of the casing 120 as the main arm 104 goes out.

The substrate G after drying with the processes above is then subjected to adhesion processing at the adhesion unit 111. Further, after cooling by the cooling unit 112, the substrate G is sent to the coating units 114 where resist is coated onto the surface of the substrate G. Then, after the substrate G is heated by the heater 113, the resist is subjected to exposure processing by the exposing apparatus (not shown). After exposure, the substrate G is carried into the developers 106 for developing. Upon completion of developing, the substrate G is carried out from the developers 106 with the main arm 104 and the substrate G is again heated and dried by the heater 109 and then accommodated in the cassette 102 at the cassette station 103.

According to the present invention, ions can be supplied to both top and bottom of the substrate and even the back of the substrate can be neutralized. Further, the present invention is characterized by that it can prevent jumping or displacement of the substrate when the substrate is lifted from the base.

What is claimed is:

1. A processing apparatus for processing a substrate, comprising:

a base that supports the substrate;

one set of fixed pins having three or more fixed pins provided on a surface of the base to form a predetermined gap between the base and the substrate;

a plurality of movable pins that move up and down the substrate on the base, said plurality of movable pins forming one set of movable pins; and a neutralization apparatus that outputs ionized gas at least into the predetermined gap between an upper surface of the base and a lower surface of the substrate from a side of the base, said neutralization apparatus being positioned adjacent to the predetermined gap.

2. The apparatus as set forth in claim 1, wherein the neutralization apparatus output the ionized gas into the gap between the upper surface of the base and the lower surface of the substrate and across an upper surface of the substrate.

3. The apparatus as set forth in claim 1, wherein the substrate comprises an insulator or a semiconductor.

4. The apparatus as set forth in claim 1 further comprising:

a casing that accommodates the base, the casing including a shutter, and a controller that controls an operation of the neutralization apparatus corresponding to opening and closing the shutter arranged at the casing that carries in and out the substrate to and from the casing.

5. The apparatus as set forth in claim 1, further comprising:

a casing that accommodates the base, the casing including a shutter that carries the substrate in and out; and a controller that controls an operation of the neutralization apparatus corresponding to a transfer arm opening and closing the shutter.

6. The apparatus as set forth in claim 1, wherein said neutralization apparatus comprises a discharge electrode to ionize gas by electric discharge and a fresh air supply that supplies fresh air to said discharge electrode.

7. The apparatus as set forth in claim 6, wherein said neutralization apparatus comprises a discharge electrode to ionize inert gas by electric discharge, a fresh air supply that supplies fresh air to said discharge electrode, and said discharge electrode disposed in the nozzle to ionize fresh air.

8. The apparatus as set forth in claim 7, wherein said nozzle is shaped so that its opening diameter gradually becomes larger like a taper.

9. The apparatus as set forth in claim 1, wherein said neutralization apparatus comprises a discharge electrode to ionize gas by electric discharge and an inert gas supply that supplies inert gas to said discharge electrode.

10. A apparatus as set forth claim 1, wherein the apparatus further comprises:

holes perforated through the base;

pins that move in and out from the upper surface of the base through the holes, lifting up and down the substrate on the base;

an elevating device that supports the pins so that the pins can shift horizontally, that move the pins up and down; and a neutralization apparatus that outputs ionized gas from a side of the base to the substrate.

11. A processing apparatus for processing a substrate, comprising:

a base that supports the substrate;

one set of fixed pins having three or more fixed pins provided on a surface of the base to form a predetermined gap between the base and the substrate;

movable pins that move the substrate on up and down relative to the base, said movable pins forming one set of movable pins;

an elevating apparatus that drives the movable pins so that the movable pins elevate slowly at first and then more quickly as the movable pins elevates the substrate, and a neutralization apparatus that outputs ionized gas at least into the predetermined gap between an upper surface of the base and a lower surface of the substrate from a side of the base, said neutralization apparatus being positioned adjacent to the predetermined gap.

12. The apparatus as set forth in claim, 11 wherein the substrate comprises an insulator or a semiconductor.

13. The apparatus as set forth in claim 11, wherein the elevating apparatus comprises a stepping motor and a controller that controls the stepping motor.

14. A processing apparatus for processing a substrate, comprising:

a base that supports the substrate;

one set of fixed pins having three or more fixed provided on a surface of the base to form a predetermined gap between the base and the substrate;

movable pins that lift up and down the substrate on the base, said movable pins forming one set of movable pins;

two or more of nozzles provided along a longer edge of the substrate, that output ionized gas at least into the predetermined gap between an upper surface of the base and a lower surface of the substrate from a side of the base to the substrate; and an ionized gas supply system that supplies ionized gas to the nozzles.

15. A processing apparatus for processing a substrate, comprising:

a base that supports the substrate;

one set of fixed pins having three or more fixed pins provided on a surface of the base to form a predetermined gap between the base and the substrate;

a plurality of movable pins that move up and down the substrate on the base, said plurality of movable pins forming one set of movable pins;

an elevating apparatus that drives the movable pins so that the movable pins elevate slowly at first and then more quickly as the movable pins elevate the substrate; and a neutralization apparatus that outputs ionized gas at least into the predetermined gap between an upper surface of the base and a lower surface of the substrate from a side of the base to the substrate, which is synchronized with the elevation of the substrate, said neutralization apparatus being positioned adjacent to the predetermined gap.

16. The apparatus as set forth in claim 14, wherein the neutralization apparatus outputs ionized gas in a plane parallel to the upper surface or the base.

17. The apparatus as set forth in claim 14, wherein the substrate comprises an insulator or a semiconductor.

18. The apparatus as set forth in claim 16, wherein the apparatus further comprises a casing that accommodates the base, the casing including a shutter at an opening for the substrate formed on said casing, and a controller that controls the operation of said neutralization apparatus according to opening and closing of the shutter.

* * * * *